United States Patent [19]

Barnett et al.

[11] Patent Number: 4,677,250

[45] Date of Patent: Jun. 30, 1987

[54] FAULT TOLERANT THIN-FILM PHOTOVOLTAIC CELL

[75] Inventors: Allen M. Barnett; Robert B. Hall, both of Newark, Del.

[73] Assignee: Astrosystems, Inc., Newark, Del.

[21] Appl. No.: 792,976

[22] Filed: Oct. 30, 1985

[51] Int. Cl.$^4$ .......................................... H01L 31/06
[52] U.S. Cl. .................................. 136/258; 136/256; 136/259; 136/260; 136/261; 136/262; 357/30; 357/59
[58] Field of Search ................. 136/256, 258 PC, 259, 136/260, 261, 262, 264, 265; 357/30, 59 D

[56] References Cited

U.S. PATENT DOCUMENTS

| | | | |
|---|---|---|---|
| 3,914,856 | 10/1975 | Fang | 29/572 |
| 3,961,997 | 6/1976 | Chu | 148/174 |
| 4,052,782 | 10/1977 | Weinstein et al. | 29/572 |
| 4,197,141 | 4/1980 | Bozler et al. | 136/258 PC |
| 4,251,286 | 2/1981 | Barnett | 136/260 |
| 4,305,776 | 12/1981 | Grabmaier | 156/605 |
| 4,319,953 | 3/1982 | Grabmaier | 156/608 |
| 4,366,338 | 12/1982 | Turner et al. | 136/258 PC |
| 4,434,318 | 2/1984 | Gibbons | 136/258 |
| 4,510,195 | 4/1985 | Iida et al. | 428/215 |
| 4,514,583 | 4/1985 | Izu et al. | 136/259 |

FOREIGN PATENT DOCUMENTS 0079790 5/1983 European Pat. Off. ............ 136/259

OTHER PUBLICATIONS

A. M. Barnett, *IEEE Trans. Electron Devices*, vol. ED-27, pp. 615-630 (1980).
D. E. Carlson et al., Final Report, U.S. D.O.E. Contract EY-76-C-03-1286.
A. M. Barnett et al., *Conf. Record, 17th IEEE Photovoltaic Specialists Conf.* (1984), pp. 747-754.
A. M. Barnett et al., *Proc. 6th E. C. Photovoltaic Solar Energy Conf.*, Reidel Pub. Co. (1985), pp. 866-870.
Abstracts, 18th IEEE Photovoltaic Specialists Conf., Las Vegas, NV (Oct. 1985), A. M. Barnett et al. and M. G. Mauk et al.
D. Kass et al., *Physica*, vol. 129B, pp. 161-165 (1985).

Primary Examiner—Aaron Weisstuch
Attorney, Agent, or Firm—Ratner & Prestia

[57] ABSTRACT

A thin-film solar cell is made up of semiconductor layers formed on a substrate. The substrate includes an insulator containing electrically conducting nucleation sites which is interposed between the electrical contact of the substrate and the adjacent semiconductor. The insulator can also be optically transparent. Grain boundaries and voids terminate on the insulator. The solar cell is fabricated by selectively introducing nucleation sites into the insulator layer which is formed on the substrate material, and activating the nucleation sites during growth of the semiconductor layers.

28 Claims, 3 Drawing Figures

FAULT TOLERANT THIN-FILM PHOTOVOLTAIC CELL

FIELD OF THE INVENTION

This invention relates to the field of art of thin-film photovoltaic solar cells for the conversion of sunlight into electricity.

BACKGROUND ART

Photovoltaic solar cells are semiconductor devices which convert sunlight into electricity. Current applications rely largely on single crystal silicon solar cells. Such solar cells have proven to be too costly for general commercial use. The principal reasons for this high cost are the expense of single crystal silicon, the cost of forming this single crystal (or large grain polycrystalline) silicon into sheets and the absence of high throughput continuous manufacturing processes.

Significant cost reductions can be achieved by using thin-film solar cells. Thin-film solar cells are made by depositing or growing thin films of semiconductors on low cost substrates. These thin-film devices can be designed to reduce consumption of semiconductor material by more than 80%. Design requirements for thin-film cells are provided by A. M. Barnett, et al., "Thin Film Solar Cells: A Unified Analysis of Their Potential," *IEEE Transactions on Electron Devices*, Volume ED-27, Number 4, April 1980, pages 615 to 630.

Development of thin-film solar cells has been inhibited by problems relating to micro- and macro-scopic defects and to fabrication techniques. Thin-film solar cells are generally polycrystalline in nature. That is, the semiconductor layers are comprised of small crystallites. Where crystallites adjoin, there are crystallographic imperfections, known in the art as grain boundaries. Grain boundaries possess properties which are different from bulk crystal properties, including their electrical and chemical properties. Grain boundaries are known to be the cause of shunts and shorting effects which degrade open circuit voltage and fill factor, recombination which degrades short circuit current, and interdiffusion which degrades reliability and stability.

Another problem confronting the development of thin-film solar cells using polycrystalline semiconductors is the occurrence of macroscopic defects such as pin-holes, voids, and cracks. An electrical short occurs when there is a pin-hole in the semiconductor layers of the solar cell and the front and back electrical contacts touch. Such macroscopic defects severely limit performance and manufacturing yield.

Still another problem is the fabrication of thin-film solar cells. Thin-film solar cells are made by sequentially growing the semiconductor layers over a substrate which includes electrical contact means and, for some solar cell designs, optimized light transmission and reflection features. Effective methods of growing semiconductor thin-films on substrates have been limited by contamination of the semiconductor growth environment by the substrate, interdiffusion and chemical reaction between the substrate and semiconductor during growth, degradation of substrate electrical and optical properties during growth, the inability to control nucleation and grain size of the semiconductor layers, and shunts and shorts caused by the grain boundaries.

Solutions to some of the aforementioned problems are known in the photovoltaic art. One solution to macroscopic defects, described in U.S. Pat. No. 4,251,286 issued Feb. 17, 1981 to A. M. Barnett, is selectively forming an insulator or appropriate semiconductor material which effectively blocks shorts and shunts that are caused by macroscopic defects in the semiconductor layers of thin-film solar cells.

D. E. Carlson, et al. indicate in United States Department of Energy Report No. SAN 1286-8, entitled "Amorphous Silicon Solar Cells, Final Report For The Period July 1, 1976 to Sept. 30, 1978 Under Contract No. EY-76-C-03-1286", October 1978, pp. 22–24, that electrical shorts can be eliminated by the use of resistive films having a thickness equal to or greater than that of the semiconducting film. The Report describes alleviating the problem of shorts due to pin-holes by use of a thick back-cermet ballast resistor such as $Ni-SiO_2$.

Solutions to microscopic defects associated with grain boundaries include selectively depositing an insulating cap at the surface intersection of the grain boundaries, described in U.S. Pat. No. 4,197,141 issued Apr. 8, 1980 to C. O. Bozler, et al. However, this approach does not eliminate the adverse effects of grain boundaries within the semiconductor layers. U.S. Pat. No. 4,366,338 issued Dec. 28, 1982 to G. W. Turner, et al. describes electrically passivating grain boundaries in p-type GaAs by introducing tin as an n-type compensating dopant into the intersticies of p-type grain boundaries. However, the grain boundary passivation approach of Turner, et al. has not proven to be effective.

Solar cells which are deposited on a substrate are described in U.S. Pat. No. 3,914,856 issued Oct. 28, 1975 to P-H. Fang. U.S. Pat. No. 3,914,856 teaches evaporating an aluminum metal contact electrode on a flexible substrate and depositing a thin layer of crystalline silicon. According to the patent, the aluminum substrate is used for a nucleation site for growth of the silicon crystals and for autodoping of the silicon. Such a solar cell embodies all of the aforementioned disadvantages that have inhibited development of thin-film solar cells. U.S. Pat. No. 3,914,856 also mentions introducing a silicon oxide layer to the substrate before the metallic electrode evaporation as an additional step. The silicon oxide layer is described as serving three purposes: electrical insulation from the substrate; reduction of diffusion between the substrate material and the semiconductor; and better matching of the substrate for growing silicon films.

U.S. Pat. No. 3,961,997 issued June 8, 1976 to T. L. Chu describes preparation of polycrystalline silicon solar cells by depositing successive layers of doped silicon on steel substrates which are coated with a diffusion barrier of silica, borosilicate, or phosphosilicate.

A problem inherent in the solar cells of the U.S. Pat. Nos. 3,914,856 and 3,961,997 is that layers of silica, silicon oxide, etc., are electrical insulators. U.S. Pat. No. 3,914,856 does not describe electrical contact means in such solar cells. U.S. Pat. No. 3,961,997 describes placing ohmic contacts in the n-and p- regions of the device on the light receiving top surface of the silicon. Thin-film solar cells with both electrical contacts on the front surface of the silicon have the disadvantages of increased cost and unacceptable losses in performance.

Some of these problems associated with growth of thin-film semiconductors on substrates can be overcome by the metallurgical barrier layers described in U.S. Pat. No. 4,571,448, issued Feb. 18, 1986 to A. M. Barnett. This patent describes barrier layers, such as silicon carbide or tin oxide. Such barrier layers serve several useful functions: prevent contamination and diffusion during semiconductor growth; electrical communication between the substrate and semiconductor layers; and enhanced optical reflection for increased efficiency. However, metallurgical barrier layers do not overcome problems associated with macroscopic defects or microscopic defects such as grain boundaries.

Applicant has recognized that these obstacles to developing high efficiency, low cost thin-film solar cells can be surmounted by providing an improved substrate for thin-film solar cells. Accordingly, an object of this invention is to provide a solar cell which includes a novel substrate having an insulator and electrically conductive nucleation sites. Another object of this invention is to provide methods for making improved thin-film solar cells which include fabrication of a novel substrate.

SUMMARY OF THE INVENTION

A thin-film solar cell comprises semiconductor layers formed on a substrate. The substrate includes an electrical contact and an insulator containing a plurality of electrically conducting nucleation sites. Microscopic and macroscopic defects which penetrate the semiconductor layers terminate on the insulator which is interposed between the electrical contact of the substrate and the adjacent semiconductor. The semiconductor layers communicate electrically with the electrical contact of the substrate through electrically conducting nucleation sites in the insulating layer. The insulating layer prevents contamination of the semiconductor layers and growth environment during growth of the semiconductor layers. The nucleation sites are located in the insulating layer such that electrical resistance and grain boundary losses are minimized.

The thin-film solar cell is fabricated in a process which comprises selectively introducing nucleation sites into the substrate material, forming an insulator layer and activating the nucleation sites during growth of the semiconductor layers. Alternatively, the process comprises selectively introducing nucleation sites into the insulator material, applying the insulator containing nucleation sites over the electrically conducting plane of the substrate and then forming the semiconductor layers.

THE DRAWINGS

DETAILED DESCRIPTION

Figure 1:
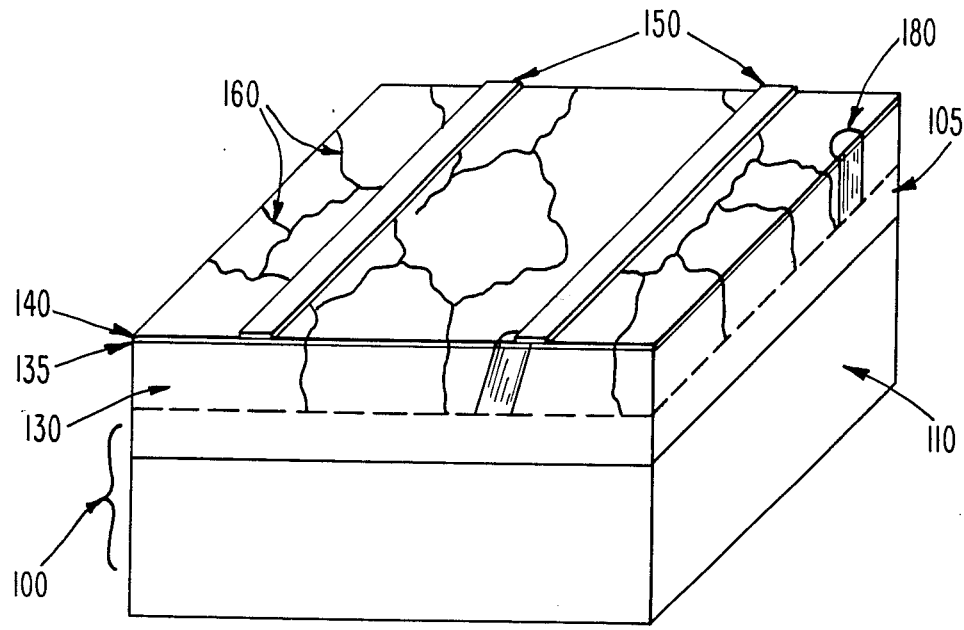
FIG. 1 is a cross-sectional view, enlarged and not to scale, illustrating macroscopic and microscopic defects in thin-film solar cells known in the art.

FIG. 1 illustrates a thin-film solar cell 10. The solar cell is formed on substrate 100. Substrate 100 includes support member 110 and first electrical contact 105, which is a continuous electrically conductive layer. Support 110 and contact 105 can be of the same material such as a sheet of steel or aluminum, in which case support 110 provides electrical contact means for operation of the solar cell. First semiconductor layer 130 is in ohmic contact with electrical contact 105. Second semiconductor layer 140 is of opposite conductivity type to layer 130 and rectifying junction 135 is formed between semiconductor layers 130 and 140. Second electrical contact 150 makes ohmic contact to layer 140. When substrate 100 is opaque to light, contact 150 is essentially transparent in the form of a grid and light enters the solar cell through layer 140. When substrate 100 is transparent to light, contact 150 may be opaque and light enters the solar cell through layer 130. Semiconductor layers 130 and 140 may be of the same material, as in homojunction solar cells, or of different materials, as in heterojunction solar cells.

When semiconductor layers 130 and 140 are polycrystalline thin films, there occur microscopic defects, such as grain boundaries 160, and macroscopic defects 180, which extend through semiconductor layers 130 and 140. Certain grain boundaries 160 are low resistance electrical paths. When at least one of the electrical contacts, 105 or 150, is continuous, electrical flow along grain boundaries can effectively shunt the solar cell. This leads to reduced open circuit voltage and fill factor. Furthermore, since nucleation of semiconductor layer 130 on contact layer 105 is essentially random, there are many closely spaced grain boundaries in semiconductor layer 130 which can act as recombination centers and reduce the output of the solar cell. Macroscopic defects 180 give rise to short circuits when second electrical contact 150 touches first electrical contact 105.

Figure 2:
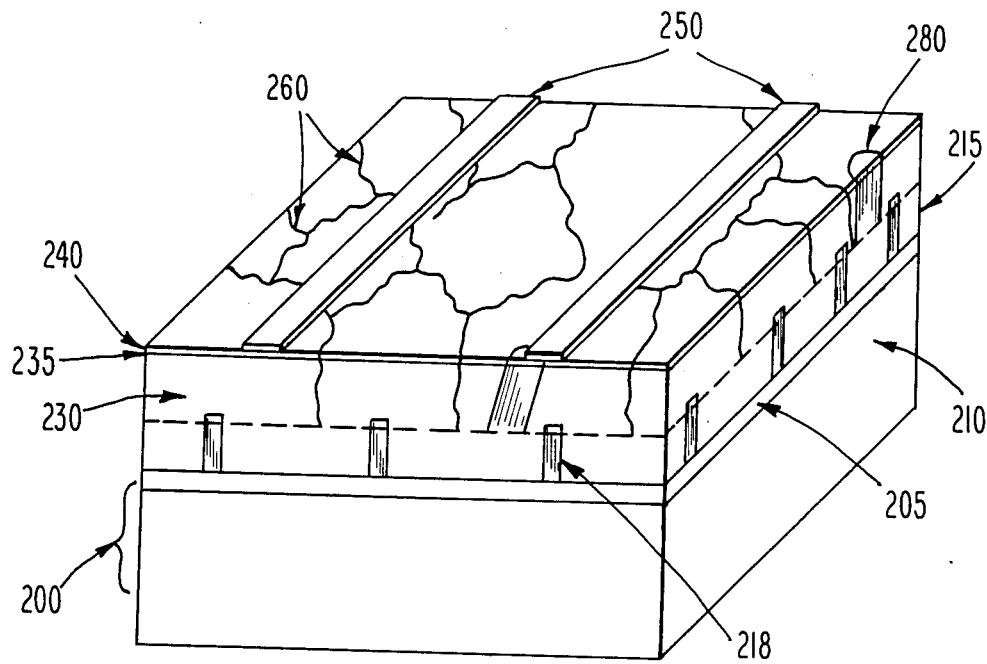
FIG. 2 is a cross-sectional view, enlarged and not to scale, of a thin-film solar cell having a substrate in accordance with this invention.

FIG. 2 illustrates a thin-film solar cell 20 which includes an improved substrate 200 in accordance with this invention. Substrate 200 comprises support member 210, electrical contact layer 205, and insulator 215. Contact layer 205 may be omitted, in which case support 210 provides electrical contact means for operation of the solar cell. Insulator 215 contains electrically conducting nucleation sites 218. In accordance with this invention, grains of first semiconductor layer 230 grow preferentially from nucleation sites 218. By selecting the distribution and spacing between nucleation sites 218, the problems of random nucleation and control of grain size are overcome. There are also contained in insulator 215 a certain number of sites (not shown in FIG. 2) which are not active. The not active nucleation sites (nonactive) are essentially insulative or are substantially less conductive than active sites.

The grains meet at grain boundaries 260 which terminate at insulator 215. Sites 218 are therefore located near the middle of each grain and are located away from grain boundaries. Each grain communicates electrically with contact 205 through nucleation sites 218. Second semiconductor layer 240, which is of opposite conductivity type to that of first semiconductor layer 230, is formed over semiconductor layer 230 to create junction 235.

Semiconductor layers 230 and 240 can be p-type and n-type silicon or n-type and p-type gallium arsenide so that junction 235 is a homojunction. A heterojunction is formed when layer 230 is gallium arsenide and layer 240 is an oppositely doped alloy of gallium aluminum arsenide or gallium arsenide phosphide. A heterojunction is also formed when one of the semiconductor layers is an n-type semiconductor, such as cadmium sulfide or zinc cadmium sulfide, and the other semiconductor layer is a p-type semiconductor such as cuprous sulfide, copper indium diselenide, or cadmium telluride. Homojunction and heterojunction solar cells utilizing these semiconductors are well known in the art and polylcrystalline solar cells comprising them are contemplated by this invention.

Second electrical contact 250 is placed in ohmic contact with semiconductor layer 240 to complete the exemplary solar cell. Anti-reflection coatings, electrical connecting means and encapsulation (all not shown) that are known in the art may also be provided.

Since grain boundaries 260 in solar cell 20 terminate on insulator 215, the shunting and shorting effects of grain boundaries are effectively eliminated so that the open circuit voltage and fill factor of solar cells made in accordance with this invention are increased. Macroscopic defects 280, which extend through semiconductor layers 230 and 240, terminate on insulator 215 or on non-active nucleation sites which are essentially insulative. Accordingly, short circuits between contacts 250 and 205 are eliminated in solar cells of this invention.

Substrate support 210 may be an electrically conducting metal, alloy, mixture, semi-metal, semiconductor material, or graphite. Metals in the form of thin sheets are preferred. Electrical contact layer 205 is provided by one surface of conductive substrate 210 or by an electrically conductive material, such as a metal, alloy, mixture, heavily doped semiconductor, conductive oxide, conductive ceramic and the like, formed thereon, and is preferably reflective to light. Insulator 215 is located over layer 205.

The objects of this invention are also realized when support member 210 of substrate 200 is an insulator. In this embodiment, the support member can be a polymer, ceramic, or glass. Electrical contact 205 is an electrically conducting layer material such as a metal, alloy, mixture, conductive ceramic, heavily doped semiconductor, or transparent conductive material such as silicon carbide, indium oxide, tin oxide, or indiumtin-oxide. Glass and tin-oxide are preferred for support member 210 and electrical contact 205, respectively, when an insulative support is employed.

The efficiency of solar cells in accordance with this invention may be further enhanced by texturing the substrate in order to provide for diffuse reflectance as taught in the aforementioned U.S. Pat. No. 4,571,448. Support 210 may be provided with a textured surface or, alternately, contact layer 205 may be textured. In general, when the support is a metal sheet, texturing its surface is preferred; when the support is an insulator such as glass or polymer, a textured contact layer is preferred. Means for texturing the surface of metal sheets and for providing textured transparent conductive oxides are known in the art.

Insulator 215 is a thermodynamically stable electrical insulator. In accordance with this invention, insulator 215 also functions as a barrier which prevents diffusion and chemical reaction between the substrate and the semiconductor layers, and contamination of the growth environment during formation of the semiconductor layers. Insulative ceramics and glasses comprising inorganic oxides, such as silica, alumina and aluminosilicates, and, similarly, carbides, nitrides, borides and mixtures thereof can be selected for insulator 215 in accordance with the teachings of this invention. Organic materials, such as polymer material selected in accordance with the teachings of this invention, are also suitable for insulator 215.

For increased solar cell efficiency, it is preferred that insulator 215 have the further property of optical transparency to light of wavelengths corresponding to energies near the band gap of semiconductor layers 230 and 240. These properties are obtained when insulator 215 is an oxide of silicon or aluminum, or mixtures thereof. The thickness of insulator 215 may be 0.1 to 100 microns.

It is further desirable to select the thickness of an optically transparent insulator 215 so that it serves as a quarter-wave reflector. When the thickness of insulator 215 is selected to satisfy the quarter-wave reflector condition, the reflectance of light from the surface of 205 back into the semiconductor layers of the solar cell is enhanced and the efficiency of the solar cell is increased. Even when the quarter-wave reflection condition for selecting the thickness of insulator 215 is omitted, optical transparency for insulator 215 provides for reflection of light from the surface of contact 205 and contributes to enhanced efficiency. Further increases in efficiency may be obtained in accordance with this invention by providing insulator 215 with a textured surface in order to provide for diffuse reflectance. The benefits and conditions for realizing enhanced efficiency from increased back surface reflection and diffuse reflection due to texturing are described in the aforementioned U.S. Pat. No. 4,571,448, the teachings of which are incorporated by reference herein.

Electrically conductive nucleation sites 218 are distributed throughout insulator 215. Sites 218 are comprised of electrically conductive particles of metal, semi-metal, or semiconductor materials. Semiconductor materials such as silicon or germanium are preferred. Sites 218 which comprise a semiconductor material contain a sufficient concentration of impurities or dopants to provide the required electrical conductivity. For example, when sites 218 are silicon, aluminum may be incorporated as a dopant to impart the needed conductivity.

Sites 218 intersect the surface of insulator 215 that is adjacent semiconductor layer 230 and provide electrical communication between the grains of semiconductor layer 230 and electrical contact 205 of the substrate. The cross-sectional area of sites 218 and their distribution within insulator 215 are selected to optimize grain size in semiconductor layer 230 and electrical resistance between the semiconductor and the substrate.

Grain size in semiconductor layer 230 is determined by the distance between nucleation sites. The relationships between grain size and current output of a solar cell are described in the aforementioned *IEEE Transactions on Electron Devices* publication of Barnett, et al. and by A. M. Barnett, et al., "Design and Development of Efficient Thin-Film Crystalline Silicon Solar Cells on Steel Substrates," *Proceedings of the Sixth European Community Photovoltaic Solar Energy Conference*, D. Reidel, Boston, 1985, pp. 886–870, which are incorporated by reference herein.

The electrical resistance is determined by the cross-sectional area of the sites, the bulk resistivity of the site material, the spacing between sites and the thickness of the insulator in accordance with Ohm's law. In general, the voltage drop due to the resistance of a site should be less than 2% of the maximum operating voltage of the solar cell when the solar cell is generating its maximum operating current. Since each site collects current generated by a single grain in layer 230, it is a straightforward matter to design the solar cell in accordance with this invention.

In one embodiment of this invention, solar cell 20 is a silicon solar cell. Substrate 200 can be a ferrous alloy such as steel or a non-ferrous material such as aluminum. The aluminum substrate should contain 5% to 25% silicon, by weight. Aluminum and silicon at the eutectic ratio, 87.4% aluminum and 12.6% silicon, in the form of a smooth sheet is preferred for an embodiment of this invention wherein nucleation sites are introduced into the substrate.

Insulator 215 can be an oxide such as an oxide of aluminum or silicon, alone or in combination, at a thickness of 0.1 to 100 microns. Alumina having the formula $Al_2O_3$ and a thickness of 0.1 to 1 microns is preferred for the case of the aluminum:silicon substrate.

Sites 218 can be silicon or germanium. Silicon doped with aluminum is preferred for sites 218. Semiconductor layer 230 is p-type silicon 2 to 50 microns thick, preferably 10 microns thick, and semiconductor layer 240 is n-type silicon less than 1.0 microns thick. The grain size in silicon semiconductor layers 230 and 240 should be at least two times the thickness as taught in the aforementioned publications by Barnett, et al.

A GaAs solar cell in accordance with this invention utilizes n-type GaAs for semiconductor 230 and p-type GaAs for semiconductor 240. P-type grain boundaries which are present in the n-type layer terminate on insulator 215. Each individual grain communicates electrically with conductor 205 through nucleation sites 218. These nucleation sites are located toward the middle of the grain and away from the grain boundary. When solar cell 20 is a GaAs solar cell in accordance with this invention, silicon nucleation sites are preferred. The resistivity of each nucleation site is less than 0.1 ohm-cm, the crosssection area is about $7 \times 10^{-8}$ sq.cm and the sites are distributed within a 0.1 to 1.0 micron thick $Al_2O_3$ insulator with an average site-to-site distance of about 10 microns.

Another GaAs solar cell in accordance with this invention includes an n-type GaAlAs blocking layer interposed between insulator 215 and n-type GaAs semiconductor layer 230. The function of blocking layers in thin-film photovoltaic solar cells is described in aforementioned U.S. Pat. No. 4,251,286. Grain boundaries which penetrate both layers terminate on insulator 215. However, p-type grain boundaries which penetrate layer 230 and terminate on the n-type GaAlAs layer form a high voltage heterojunction in parallel with the n/p GaAs homojunction so that grain boundary shorts are further blocked. Solar cells utilizing GaAs in accordance with this invention may also include a p-type GaAlAs window layer over p-type GaAs layer 240 in order to reduce surface recombination and to enhance the efficiency of the solar cell. GaP or graded GaAsP can also be used for the window layer, as taught in U.S. Pat. No. 4,582,952, issued Apr. 15, 1986 to J. B. McNeely and A. M. Barnett, the teachings of which are incorporated by reference herein. When a GaAs solar cell in accordance with this invention is of the type "N on P," wherein layer 230 is p-type and layer 240 is n-type, p-type grain boundaries terminate in the window layer.

Figure 3:
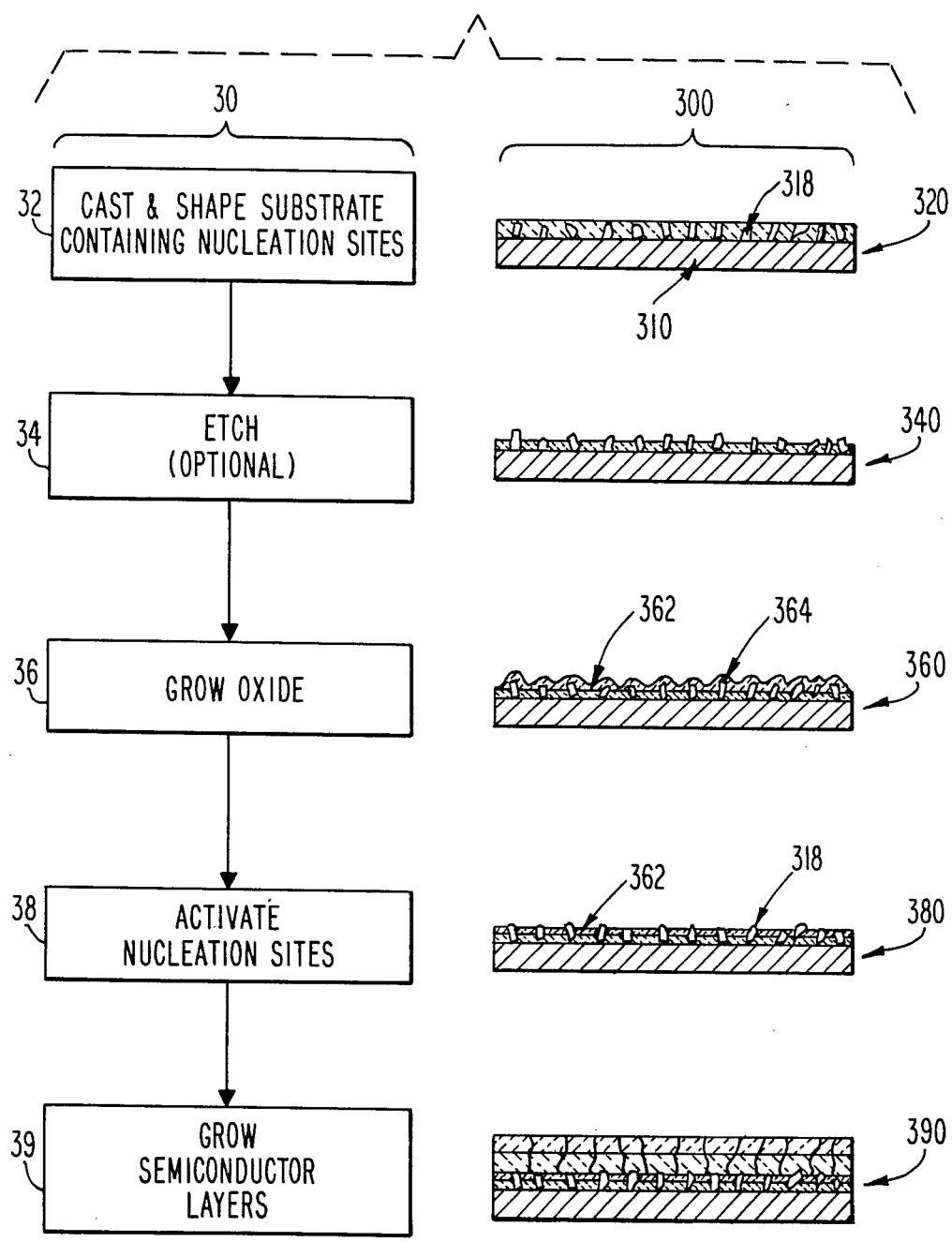
FIG. 3 is a diagram illustrating the steps for making a substrate and including cross-sectional views, enlarged and not to scale, of the substrate in accordance with this invention.

An essential feature of this invention is preparation of substrates having an insulator and electrically conducting nucleation sites. A broad embodiment of the invention is illustrated in FIG. 3 where the steps, 30, and cross-sectional views, 300, of the substrate at the completion of each step are shown. Beginning with step 32, the material of nucleation sites 318 is introduced into the substrate material 310 and the substrate containing nucleation site material 318 is shaped, thereby forming intermediate substrate 320. Optional step 34 is selectively etching the substrate to expose the sites, yielding intermediate substrate 340. Optional step 34 may be accomplished by chemical etching of the metal as is known in the art. For example, hydrochloric acid etches aluminum without significantly etching silicon. Step 36 is forming an insulator by oxidation resulting in oxides 362 and 364 covering the substrate material and sites, respectively, and yielding intermediate substrate 360. Step 38 is activating the sites by selectively removing oxide 364, thereby exposing nucleation sites 318 on the surface of substrate 380 whereon the semiconductor layers are formed. Activation of the sites can take place in a separate step prior to forming the semiconductor layers. Methods for activating sites are chemical etching, plasma etching, and vapor phase etching using a halogen bearing gas. Preferably, activation is accomplished during the initial stages of growth of the semiconductor layers. For example, when growth of the semiconductor layers is by the preferred solution growth method, a small amount of a selected chemical reducing agent added to the growth solution will chemically reduce oxides covering nucleation sites, but will not attack the insulator. The reducing agent is preferably selected on the basis of thermodynamics. For example, the change in free energy resulting from reaction between the reducing agent and the site oxide should be negative, while the free energy change for reaction between the reducing agent and the insulator should be positive. Tabulated values of standard enthalpies of formation are useful for selecting the reducing agent in accordance with the teachings of this invention. However, when thermodynamic data is unavailable or when activating the sites involves chemical reactions other than reduction of an oxide, experimentation will provide the necessary information to select agents that are effective for activating the sites.

An example of the method of FIG. 3 in accordance with this invention includes preparing a mixture of aluminum and silicon, melting the mixture, and casting an ingot of the mixture in which silicon crystallites are dispersed in the aluminum. The silicon sites of this invention. Aluminum containing 5% to 25% silicon may be used. An aluminum-silicon eutectic having a melting point of 577° C. and a composition of 12.6% silicon and 87.4% aluminum is preferred in order to obtain a narrow distribution of silicon crystallite sizes and desirable mechanical properties for shaping. The ingot is then shaped to a configuration suitable for use as a substrate, preferably by rolling, to form thin sheets. The electrical conductivity of the silicon sites, required by the teachings of this invention, is provided by the doping effect of aluminum.

The substrate is then exposed to oxygen at temperatures of 200° to 400° C. for a period of 2 to 20 minutes, forming $Al_2O_3$ insulator over the substrate and $SiO_2$ over the sites by thermal oxidation. The oxidation is carried out to an extent sufficient to provide a thickness of insulator in accord with the teachings of this invention. Alternatively, the oxidation may be accomplished by electrolytic anodization or by exposure to an oxygen containing plasma. Thermal oxidation in dry oxygen at a temperature of 300° C. for 10 minutes is preferred.

Silicon semiconductor layers are preferably deposited by the solution growth method, described in the aforementioned U.S. Pat. No. 4,571,448, whereby silicon is deposited from a saturated solution in molten tin in the presence of a temperature gradient. For the selected reducing agent of this invention, 1% aluminum is added to the growth solution. Magnesium, though less preferred, may also be used as the reducing agent. Contact between the substrate and the molten tin containing aluminum selectively removes the $SiO_2$, thereby exposing and activating the sites. Once the sites are thus activated, crystallites of silicon grow to form the semiconductor layers of the solar cell of this invention.

The preferred method of solution growth in accordance with this invention may also be practiced using a variety of solvents which are known in the art. D. Kass et al. in a publication entitled "Liquid Phase Epitaxy of Silicon: Potentialities and Prospects", Physica, Vol. 129B, pp. 161–165 (1985), which is incorporated by reference herein, describe use of Ga, In, Sn, Bi and alloys of these elements which dopants such as P or As. Other solvents such as lead or germanium, and other dopants such as Sb, In, Al, or Ga may also be used for growing the semiconductor layers.

Alternate methods of forming the semiconductor layers to fabricate solar cells according to this invention include chemical vapor deposition, plasma assisted chemical vapor deposition, vacuum evaporation, sputtering, electrodeposition, and spray pyrolysis, all of which are well known in the thin-film semiconductor and photovoltaic arts. The layers may be re-crystallized in order to enhance grain size.

Solar cells utilizing GaAs in accord with this invention can also be fabricated using the method of FIG. 3 whereby an aluminum-silicon substrate includes an aluminum oxide insulator containing silicon sites. When the GaAs semiconductor layer is grown from a saturated solution in molten Ga, activation of the sites occurs by contact with molten gallium containing 1% aluminum.

A second method for fabricating solar cells in accordance with this invention comprises selectively introducing nucleation site material into an insulator material, applying the insulator containing site material over the electrical contact layer of the substrate member, activating the sites and forming the semiconductor layers thereon. For example, an insulator containing introduced sites can be prepared and applied using the methods of thick film hybrid circuit art. Solid particles of $Al_2O_3$, $SiO_2$ and other oxides selected in accordance with the teachings of this invention may be used alone or in combination to form the insulator material.

For the site material, silicon or germanium or precursors such as oxides of silicon or germanium may be used. The insulator and site materials are thoroughly mixed with a liquid vehicle, such as amyl acetate, and other agents known in the thick film art to form a suspension or paste. The paste is applied to the substrate using screen printing, doctor blading, roller coating, spraying or like techniques. The coated substrate is dried and fired whereby a dense adherent layer of insulator containing sites is formed on the substrate. Electrical continuity between nucleation sites and the conducting plane of the substrate is established either during the firing step or during growth of the semiconductor layers. Activation of the sites and semiconductor growth in accordance with this invention are as described above.

Insulator containing sites can also be applied to the substrate using the methods of plasma or flame spraying, sputtering, vacuum evaporation, chemical vapor deposition and the like as are known in the art of depositing composite materials and cermets.

The method of applying an insulator already containing sites is particularly suited to fabricating a solar cell on stainless steel or glass substrates in accordance with this invention. For example, a chrome steel sheet (Alloy 27) is provided with a silica alumina glass insulator containing nucleation sites by mixing them in amyl acetate liquid vehicle, spraying and firing near the softening point of the composite glass. The sites are activated during growth of the semiconductor layers by the solution growth method when 1% aluminum is added to the tin or other suitable solvent. When glass is used instead of steel, a transparent conductive coating, such as tin oxide, is applied prior to applying the insulator containing sites material.

Electronic and opto-electronic devices which comprise thin-film semiconductor materials formed on substrates are also contemplated by this invention. For example, improved light emitting diodes, photodetectors, thin-film transistors and the like may be fabricated by forming semiconductor layers on an insulator containing electrically conductive nucleation sites.

What is claimed is:

1. In a thin-film photovoltaic solar cell comprising, in order, a substrate, a first electrical contact, at least one semiconductor layer including at least one photovoltaic junction, and a second electrical contact, the improvement being an insulator containing electrically conductive nucleation sites interposed between the first electrical contact and at least one semiconductor layer, whereby microscopic and macroscopic defects in the semiconductor layer terminate primarily on the insulator rather than on the first electrical contact and the nucleation sites provide for electrical communication between the first electrical contact and the semiconductor layer.

2. In the solar cell of claim 1 wherein the insulator is a ceramic or glass material.

3. In the solar cell of claim 1 wherein the insulator is selected from the group consisting of inorganic oxides, carbides, nitrides, borides, silicates, and mixtures thereof.

4. In the solar cell of claim 3 wherein the insulator is a mixture of aluminum oxide and silicon oxide.

5. In the solar cell of claim 3 wherein the insulator is aluminum oxide.

6. In the solar cell of claim 1 wherein the insulator is 0.1 to 100 micrometers thick.

7. In the solar cell of claim 1 wherein the nucleation site material is selected from the group consisting of metals, semi-metals and semiconductors.

8. In the solar cell of claim 7 wherein the site material is germanium.

9. In the solar cell of claim 7 wherein the site material is silicon.

10. In the solar cell of claim 9 wherein the site material is heavily doped silicon having a resistivity of less than 0.1 ohm-cm.

11. In the solar cell of claim 10 wherein the site material is silicon doped with aluminum.

12. In the solar cell of claim 1 wherein at least one semiconductor layer is polycrystalline and the size and distribution of sites within the insulator are selected such that grain size in the semiconductor layer and electrical resistance within the cell are optimum.

13. In the solar cell of claim 1 wherein the substrate is selected from the group consisting of metals, semi-metals, metallurgical grade semiconductors, ceramics, glass, and polymers.

14. In the solar cell of claim 13 wherein the substrate is metal in sheet form.

15. In the solar cell of claim 14 wherein the substrate is a ferrous alloy.

16. In the solar cell of claim 13 wherein the substrate is glass.

17. In the solar cell of claim 16 wherein the first electrical contact is a transparent conductor selected from the group consisting of silicon carbide, tin oxide, indium oxide and mixtures thereof.

18. In the solar cell of claim 17 wherein the first electrical contact is tin oxide.

19. In the solar cell of claim 1 wherein the insulator is optically transparent.

20. In the solar cell of claim 19 wherein the first electrical contact is reflective to light.

21. In the solar cell of claim 19 wherein the thickness of the insulator is selected whereby the insulator serves as a quarter-wave reflector.

22. In the solar cell of claim 1 wherein the substrate surface is textured to provide for diffuse reflection of light.

23. In the solar cell of claim 1 wherein the first electrical contact is textured to provide for diffuse reflection of light.

24. In the solar cell of claim 1 wherein the solar cell is a silicon solar cell comprising oppositely doped regions of silicon semiconductor and a homojunction therebetween.

25. In the solar cell of claim 1 wherein the solar cell is a gallium arsenide solar cell comprising oppositely doped regions of gallium arsenide semiconductor and a homojunction therebetween.

26. In the solar cell of claim 1 wherein the semiconductor includes oppositely doped layers of gallium arsenide and gallium aluminum arsenide and a heterojunction therebetween.

27. In the solar cell of claim 1 wherein the semiconductor includes oppositely doped layers of gallium arsenide and gallium phosphide and a heterojunction therebetween.

28. In the solar cell of claim 1 wherein the semiconductor includes n-type cadmium sulfide and a p-type semiconductor selected from the group consisting of cadmium telluride, copper indium diselenide, and copper sulfide.

* * * * *